US012301138B2

(12) United States Patent
Kim et al.

(10) Patent No.: US 12,301,138 B2
(45) Date of Patent: May 13, 2025

(54) PIEZOELECTRIC MOTORS WITH NANOMETER-LEVEL RESOLUTION

(71) Applicant: Moeemotion Inc., Gyeongsangbuk-do (KR)

(72) Inventors: Jee-hoon Kim, Gyeongsangbuk-do (KR); Jin-young Youn, Gyeongsangnam-do (KR)

(73) Assignee: MOEEMOTION INC., Gyeongsangbuk-do (KR)

( * ) Notice: Subject to any disclaimer, the term of this patent is extended or adjusted under 35 U.S.C. 154(b) by 228 days.

(21) Appl. No.: 18/245,931

(22) PCT Filed: Jun. 11, 2021

(86) PCT No.: PCT/KR2021/007350
§ 371 (c)(1),
(2) Date: Mar. 20, 2023

(87) PCT Pub. No.: WO2022/059888
PCT Pub. Date: Mar. 24, 2022

(65) Prior Publication Data
US 2023/0387828 A1    Nov. 30, 2023

(30) Foreign Application Priority Data
Sep. 21, 2020   (KR) .................. 10-2020-0121576

(51) Int. Cl.
*H02N 2/02* (2006.01)
*H02N 2/04* (2006.01)
(Continued)

(52) U.S. Cl.
CPC .............. *H02N 2/025* (2013.01); *H02N 2/04* (2013.01); *H02N 2/06* (2013.01); *H10N 30/206* (2023.02)

(58) Field of Classification Search
CPC ...... H02N 2/025; H02N 2/062; H02N 2/0055; H02N 2/04; H10N 30/206; G02B 7/02
See application file for complete search history.

(56) References Cited

U.S. PATENT DOCUMENTS 5,912,527 A      6/1999   Karrai
7,638,929 B2 *  12/2009   Richter ................. H02N 2/101
                                                    310/311

(Continued)

FOREIGN PATENT DOCUMENTS

| JP | 4931425 B2 | 5/2012 |
| KR | 2012-0007308 A | 1/2012 |
| KR | 10-2147514 B1 | 8/2020 |

OTHER PUBLICATIONS

International Search Report for corresponding International Application No. PCT/KR2021/007350 mailed Dec. 28, 2021.
(Continued)

*Primary Examiner* — Emily P Pham
(74) *Attorney, Agent, or Firm* — Chrisman Gallo Tochtrop LLC

(57) ABSTRACT

The present invention relates to a piezoelectric motor that can be moved with very fine resolution at the nanometer level by means of a piezoelectric element (piezo actuator) that increases in length when a voltage is applied. The piezoelectric motor according to the invention is characterized by comprising a body having an upper surface and a lower surface, and a side connecting the upper surface and the lower surface, a piezoelectric material disposed on the upper surface of the body and extending longitudinally therefrom, and a rod having an upper surface and a lower surface, and extending longitudinally, and having one end connected to one end of the piezoelectric material and disposed on the upper surface of the body, and a support member disposed to span the rod and providing a predeter-
(Continued)

mined frictional force on the rod, wherein the support member is driven by the rod to interlock with a contraction or an expansion of the piezoelectric material, wherein a lower surface of the support member and the upper surface of the body are at least partially in butted, and wherein the support member is driven by sliding on the upper surface of the body.

6 Claims, 11 Drawing Sheets

(51) Int. Cl.
*H02N 2/06* (2006.01)
*H10N 30/20* (2023.01)

(56) References Cited

U.S. PATENT DOCUMENTS

| | | |
|---|---|---|
| 8,369,037 B2 | 2/2013 | Lee |
| 2006/0238074 A1 | 10/2006 | Manabe |
| 2010/0115671 A1 | 5/2010 | Pryadkin et al. |
| 2012/0014003 A1 | 1/2012 | Lee |

OTHER PUBLICATIONS

Written Opinion for corresponding International Application No. PCT/KR2021/007350 dated Dec. 28, 2021.

* cited by examiner

FIG 10 -- Prior Art --

-- Prior Art --

PIEZOELECTRIC MOTORS WITH NANOMETER-LEVEL RESOLUTION

TECHNICAL FIELD

The present invention relates to a piezoelectric motor that can move with very fine resolution at the nanometer level by using a piezoelectric actuator that stretches in length when a voltage is applied.

BACKGROUND ART

A piezoelectric material is a material that generates a voltage when pressurized and vibrates and deforms mechanically when a voltage is applied. Based on these physical properties, piezoelectric material is used in a variety of technologies, including piezoelectric motors, also known as piezoelectric actuators.

Unlike electromagnetic motors, these piezoelectric motors do not require magnets or windings, nor do they require complex gear structures to transmit power. As a result, piezoelectric motors have the advantage of being quieter and less noisy than electromagnetic motors and are well suited for miniaturization.

In particular, in scanning probe microscopy, which measures physical quantities such as atomic forces, tunneling currents, and electromagnetic forces acting between a specimen and a probe, the piezoelectric motors described above are often used to move the specimen and probe to precise distances from nanometers (nm) to micrometers (μm).

A piezoelectric motor for realizing fine movements from nanometers (nm) to micrometers (μm), in the following patent disclosure, as shown in FIG. 10, A piezoelectric motor that includes a base plate(1), a carriage(2) moving on the base plate(1), a bearing(3) enabling the carriage(2) to slide on the base plate(1), a piezoelectric element(4), and a graphite rod(5) connected to the piezoelectric element(4), and control position with nanometer (nm) level resolution by deformation of the piezoelectric element (4) by controlling the normal force through screws(9) including springs(10) on both sides of the piezoelectric element(4).

However, in order to reduce friction between the carriage (2) which is interlocked with the graphite rod(5) and the base plate(1), the piezoelectric motor has structure that a spaced-out or inserted bearing. However, such the structure is not only complicated, but also has the problem that if the gap between the two parts is not parallel, it will move at an inclined angle and eventually cannot perform accurate linear motion.

Furthermore, in the case of the piezoelectric motor (piezoelectric motor for XY scanner) disclosed in the following patent disclosure, the part supporting the graphite rod(5) is skewed to one side compared to the entire part, and the fixing force of the bolts and springs causes the rear part to spread as shown in FIG. 11 (in particular, when the graphite rod(5) moves in one direction, the contact area is reduced). This changes the movement of the graphite rod(5), making it difficult to perform precise movements and reducing the distance the motor can move. It can even cause the motor to stop moving.

(Prior art reference 1) U.S. Patent Publication No. 5,912,527

DISCLOSURE

Technical Problem

The present invention addresses the problems of the prior art described above, it is an object of the present invention to provide a piezoelectric motor that can achieve extremely fine resolution at the nanometer level, greatly expanding the range from a few nanometers to a few millimeters, and that is structurally easy to fabricate and capable of precise linear motion without the use of bearings.

Also, it is another object of the present invention to provide a piezoelectric motor with a position sensor that can obtain accurate information about the position of a workpiece without affecting the movement of the piezoelectric motor.

Technical Solution

To accomplish the above object, a first aspect of the invention provides a piezoelectric motor comprising a body having an upper surface and a lower surface, and a side connecting the upper surface and the lower surface, a piezoelectric material disposed on the upper surface of the body and extending longitudinally therefrom, and a rod having an upper surface and a lower surface, and extending longitudinally, and having one end connected to one end of the piezoelectric body and disposed on the upper surface of the body, and a support member disposed to span the rod and providing a predetermined frictional force on the rod, wherein the support member is driven by the rod to interlock with a contraction or an expansion of the piezoelectric material, wherein a lower surface of the support member and the upper surface of the body are at least partially in butted, and wherein the support member is driven by sliding on the upper surface of the body.

Wherein the butted portions may be polished with abrasive paper of 600 grit or more, or may be polished to have a surface roughness lower than a surface roughness obtainable with the abrasive paper.

Wherein the support member may include an upper support disposed on an upper of the rod, and formed to abut the upper surface of the rod by at least a portion of a lower having a shape corresponding to the upper surface of the rod and a lower support disposed on a lower side of the rod, and formed to abut the lower surface of the rod by at least a portion of a upper having a shape corresponding to the lower surface of the rod, a side support having an aperture for inserting the rod, and disposed on a side of the upper support and the lower support, and hold to maintain a spacing between the upper support and the lower support, wherein a friction force control means for adjusting a friction force applied to portions abutting the rod may be put in a portion formed to abut the upper surface of the rod of the upper support and a portion formed to abut the lower surface of the rod of the lower support.

Wherein the side support may include a first side support disposed on one side of the upper support and the lower support in the direction from which the rod extends, and a second side support disposed on one side opposite the one side of the upper support and the lower support in the direction from which the rod extends, a fastening member holding the first side support and the second side support.

Wherein the friction force control means may include a bolt inserted into either a portion formed to abut the upper surface of the rod of the upper support or a portion formed to abut the lower surface of the rod of the lower support, a spring inserted into the outer circumference of the bolt, and a helix part formed proximate end of the bolt to hold the end of the bolt.

To accomplish the above object, a second aspect of the invention provides a piezoelectric motor comprising a body having an upper surface and a lower surface, and a side connecting the upper surface and the lower surface, a piezoelectric material disposed on the upper surface of the body and extending longitudinally therefrom, and a rod having an upper surface and a lower surface, extending longitudinally and having a one end fixed to a one end of the piezoelectric material, and disposed on the upper surface of the body, and a support member disposed to span the rod, and providing a predetermined frictional force on the rod, and a position sensor for detecting a position of the support member, wherein the support member is driven by the rod to interlock with a contraction or an expansion of the piezoelectric material, wherein the position sensor includes, a conductive strip disposed on one side parallel to a direction of driving of the support member, a first elastomer in contact with the conductive strip, and a resistance strip disposed on a different side of the support member opposite the one side, and a second elastomer in contact with the resistance strip, wherein the first elastomer and the second elastomer are arranged such that the elastic forces exerted on the support member cancel each other out.

Advantageous Effects

The piezoelectric motor according to the present invention, compared to a mechanically driven step motor, is highly reliable for position control because there is no reverse rotation that can occur when mechanically engaged, and because the step size can be adjusted by changing the voltage, the desired movement can be obtained, and precise adjustment is possible.

Also, since the lower surface of the walk-in support member is driven by sliding while directly contacting the upper surface of the body, the structural stability is excellent compared to the prior art bearing or spacing structure, which facilitates linear motion and solves the problem of the piezoelectric material and rod tilting under force.

Also, since the piezoelectric motor of one embodiment of the present invention has side support holding means, it is possible to prevent the spreading of the upper and lower support comprised the support members, thereby solving the problem that the movement of the piezoelectric motor caused by the spreading of the support members in the prior art piezoelectric motor is slowed down.

This enables the piezoelectric motor according to the present invention to achieve extremely fine resolution at the nanometer level, which can be significantly extended to the range of a few nm to a few mm.

In addition, the piezoelectric motor according to another embodiment of the present invention includes a contact position sensor that can acquire a position more precisely than an optical position sensor, and the position sensor is put in mutually opposite sides of a support member by separating a conductive strip and a resistance strip, and two finger springs for measuring resistance are arranged mutually opposite to each other so that their elastic support forces cancel each other, thereby eliminating the problem that the piezoelectric motor is damaged by the elastic support force of the finger springs, or that the motion of the piezoelectric motor is affected and the precision of the linear motion is reduced.

BEST MODE

Hereinafter, embodiments of the present invention will be described with reference to the accompanying drawings to illustrate their composition and operation.

In describing the invention, specific descriptions of relevant known features or configurations are omitted where it is deemed that such descriptions would unnecessarily obscure the essence of the invention. Furthermore, when a portion is said to "include" a component, it is meant to be inclusive of other components, not exclusive of other components, unless specifically stated to the contrary.

Embodiment 1

Figure 1:
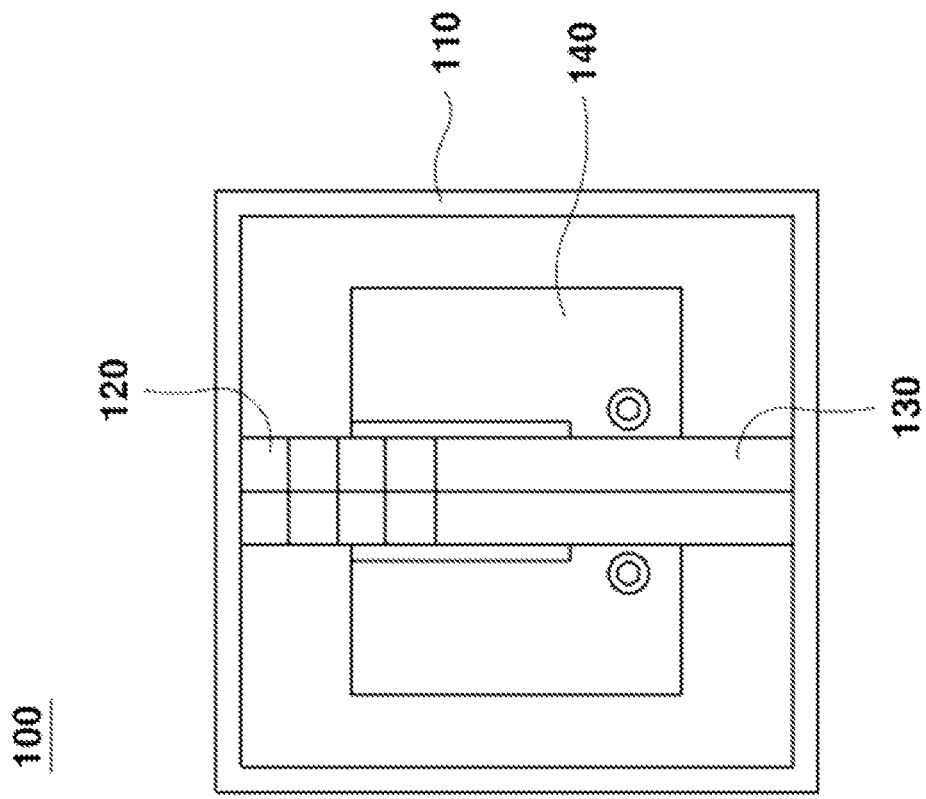
FIG. 1 is a plan view of a piezoelectric motor according to Example 1 of the present invention.
Figure 2:
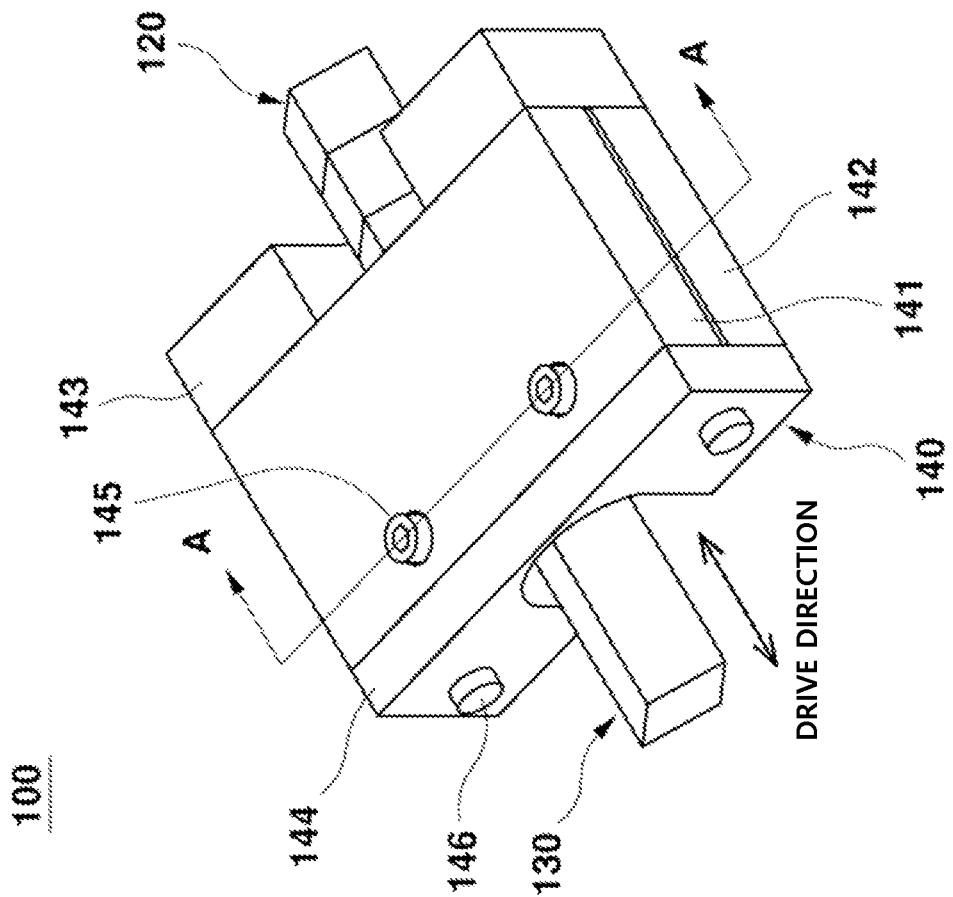
FIG. 2 is a perspective view of a portion, excluding the body, comprising a piezoelectric motor according to embodiment 1 of the present invention.
Figure 3:
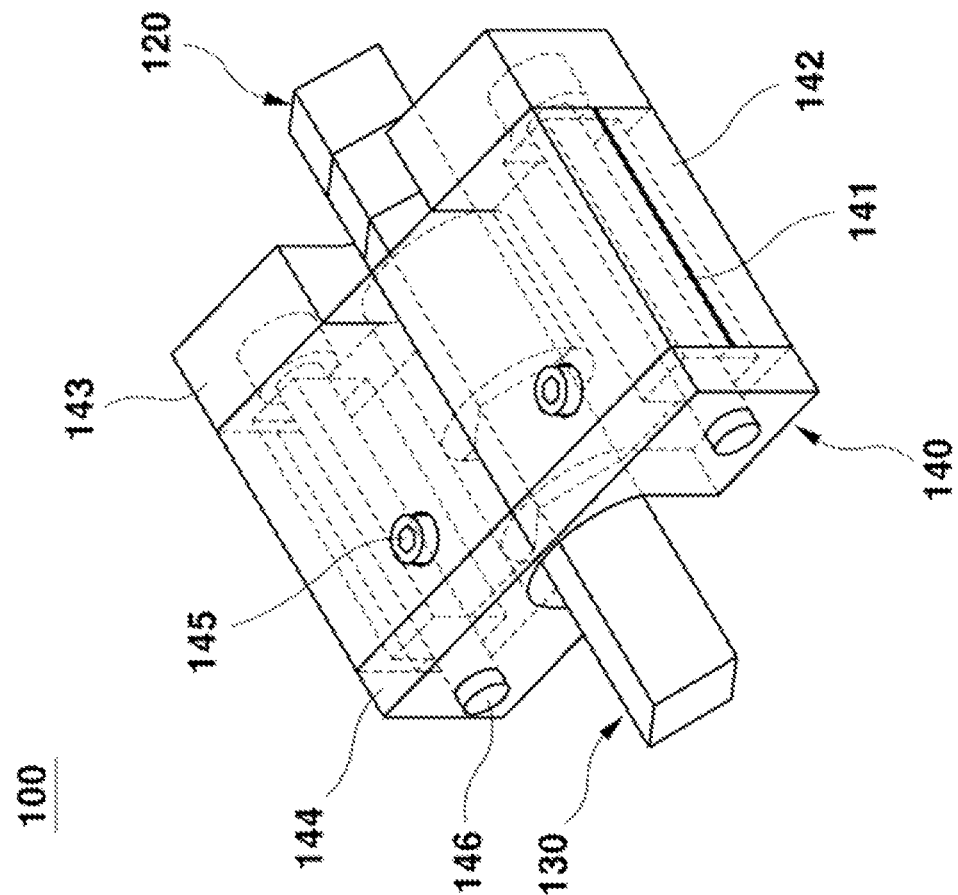
FIG. 3 is a perspective view of FIG. 2.
Figure 4:
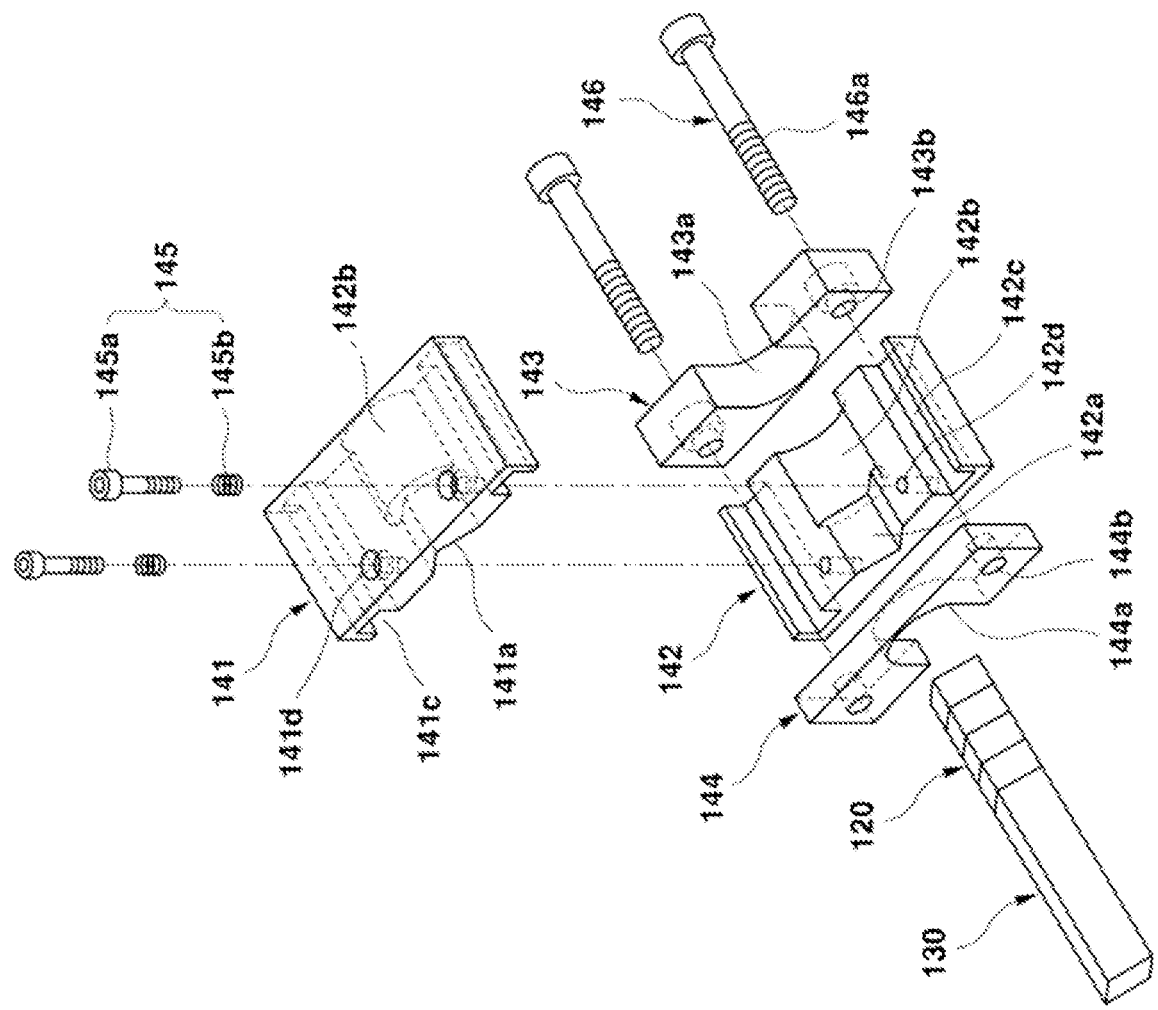
FIG. 4 is an exploded perspective view of FIG. 2.
Figure 5:
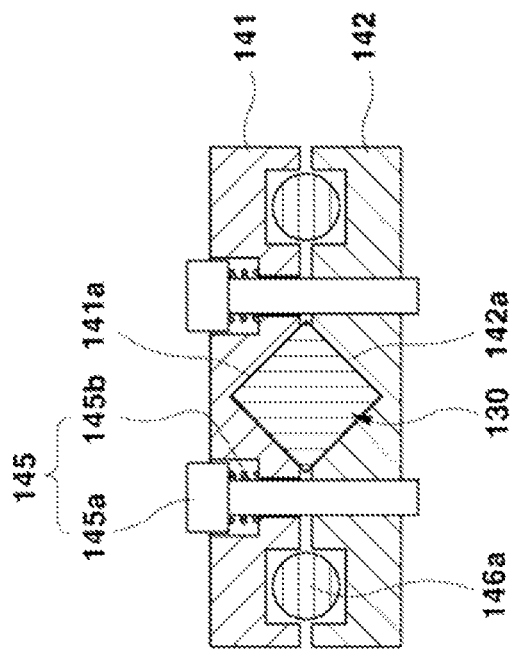
FIG. 5 is an A-A cross-sectional view of FIG. 2.

FIG. 1 is a plan view of a piezoelectric motor according to Example 1 of the present invention, and FIG. 2 is a perspective view of a portion, excluding the body, comprising a piezoelectric motor according to embodiment 1 of the present invention, and FIG. 3 is a perspective view of FIG. 2, and FIG. 4 is an exploded perspective view of FIG. 2, and FIG. 5 is an A-A cross-sectional view of FIG. 2.

Referring to FIG. 1, a piezoelectric motor (100) according to embodiment 1 of the present invention comprises a body (110), a piezoelectric material (120) disposed on the body (110), a rod (130) associated with the piezoelectric material (120), and a support member (140) formed to carry the rod (130).

The body (110) is formed to have a upper surface and a lower surface and a side connecting the upper surface and lower surface, and in embodiment 1 of the present invention is formed to be approximately square when viewed from above. In embodiment 1 of the present invention, the shape of the body (110) is formed as a rectangle when viewed from above, but it is not particularly limited to a rectangle if each configuration arranged on the body (110) can operate smoothly.

The body (110) is preferably made of titanium or a titanium alloy, provided that it has low deformation at low temperatures and is impervious to magnetic fields, but is not necessarily limited thereto and may be made of other materials such as aluminum, stainless steel, or the like, depending on the application.

The piezoelectric material (120) has the shape of a roughly square column extending longitudinally stacked with one or more piezoelectric elements that expand/contract when a voltage is applied. Further, a first part of the piezoelectric material (120) is fixed to the body (110).

Whether the piezoelectric elements are made of a single piezoelectric element, a plurality of piezoelectric elements stacked together, or the material of the piezoelectric elements can be varied according to performance, such as the size of the workpiece (support member) and the scanning range required by the piezoelectric motor.

As shown in FIGS. 1 to 4, the piezoelectric material (120) is formed in the shape of a square column to match the shape of the rod (130), but the shape of the piezoelectric material may be formed in a shape other than square, such as circular, to match the shape of the rod (130), or may be formed in a shape different from the shape of the rod (130).

The rod (130) is intended to provide inertia movement while operating in interlock with the contraction/expansion motion of the piezoelectric material (120). The rod (130) is formed as a longitudinally extending square column, with one end connected to an other end not fixed to the body (110) of the piezoelectric material (120). Here, the rod (130) being connected to the piezoelectric material (120) includes being physically bonded, or simply in contact with it.

The rod (130) may preferably be made of graphite, and the material is not necessarily limited to graphite as long as it is capable of functioning as a rod (130).

Also, the graphite rod (130) is preferably polished using an abrasive paper of 600 grit or more to reduce the coefficient of friction of the surface, and more preferably using a SiC-based abrasive paper of 800 grit or more.

The support member (140) comprises an upper support (141), a lower support (142), a first side support (143), a second side support (144), friction force control means (145), and side support holding means (146), as shown in FIG. 4.

All of the lower surfaces of the members (142, 143, 144) that comprise the lower surfaces of the support member (140), or at least a portion of the lower surfaces of the lower support (142), are arranged to be in direct contact with the upper surface of the body (110). Accordingly, the support member (140) is driven in the form of sliding on the upper surface of the body (110).

To do this, the upper surface of the body (110) on which the support member (140) slides and the lower surface of the support member (140) are preferably polished using an abrasive paper of 600 grit or more, that is, the surface roughness is lowered to enable sliding operation of the support member (140). In embodiment 1 of the present invention, the support member (140) was polished using abrasive paper, but any polishing method that can keep the surface roughness lower than that of the abrasive paper can be used without limitation.

In embodiment 1 of the present invention, since the surface roughness of the mutually contacting surfaces of the body (110) and the support member (140) is reduced and the support member (140) and the body (110) are sliding in direct contact, it is structurally stable compared to the conventional method of arranging bearings or spacing between the support member and the body, so that the problem of tilting due to the gap formed between the body and the support member in the conventional piezoelectric motor or the problem of tilting of the piezoelectric body and the rod under the force can be solved.

The upper support (141) is disposed on the upper surfacer of the rod (130), and a portion of the center of the lower surface has a V-shaped groove(141a) formed to correspond to a square cross-section of the rod (130), a roughly semicircular groove (141b) is formed extending from the V-shaped groove, and a roughly square groove (141c) is formed on both sides of the lower surface to insert the side support holding means (146). On both sides of the V-shaped groove (141a), fastening holes (141d) are formed for fastening the friction force control means (145).

The lower support (142) is arranged at the lower end of the rod (130), for inserting the rod (130) together with the upper support member (141), and a V-shaped groove (142a) is formed in a portion of the center of the upper surface to correspond to a square cross-section of the rod (130), a roughly semicircular groove (142b) is formed extending from the V-shaped groove (142a), and on both sides of the upper surface are formed roughly square grooves (142c) for inserting the side support holding means (146). On both sides of the V-shaped groove (142a), the fastening holes (142d) are formed for engaging the friction force control means (145). A helix part (not shown) is formed in at least a portion of the inner side of the fastening holes (142d).

The first side support (143) is disposed on one side of the upper and lower support (141, 142), which are disposed above and below the rod (130), and comprises a roughly semicircular groove (143a) in the center, as shown in FIG. 4, and the fastening holes (143b) are formed on both sides for inserting the side support fixing means 146.

The second side support (144) is arranged on the other side of the upper and lower support (141, 142), which are arranged above and below the rod (130), and is formed in the center with a roughly semicircular groove (144a) facing in a direction opposite to the first side support (143), and with the fastening holes (144b) formed on both sides for inserting the side support holding means (146).

The friction force control means (145) are means for controlling the friction force between the rod (130) and the support member (140).

The friction force control means (145) comprises two bolts (145a), as shown in FIGS. 4 and 5, and two springs (145b), which are inserted into the two bolts (145a) respectively, and with the springs (145b) inserted, the bolts (145a) are inserted into the fastening holes (141d) of the upper support (141), thereby engaging a helix formed in the fastening holes (142d) of the lower support member (142).

By adjusting the length of the bolt (145a) and spring (145b), the normal force between the rod (130) and the surfaces of the upper and lower support members (141, 142) tangent to the rod (130) can be adjusted, and thereby the frictional force exerted on the rod (130) can be adjusted.

The side support holding means (146) comprises two bolts. The bolts are inserted into fastening holes (143b) formed in the first side support (143), pass through square grooves (141c, 142c) formed in the upper and lower supports (141, 142) respectively, and are inserted into fastening holes (144b) formed in the second side support (144), and are helically engaged with a helix part formed in the fastening holes (144b). By means of these side support holding means (146), the gap between the upper and lower support (141, 142) can be maintained at a constant distance without widening or narrowing in any part of the rod (130) other than that supported by the friction force control means (145), thus enabling the rod (130) to perform a more precise linear motion.

After that, the operation process of the piezoelectric motor (100) according to embodiment 1 of the present invention will be described.

The piezoelectric motor (100) according to embodiment 1 of the present invention can be driven in a stick-slip motion by utilizing a voltage with a sawtooth waveform.

Figure 6:
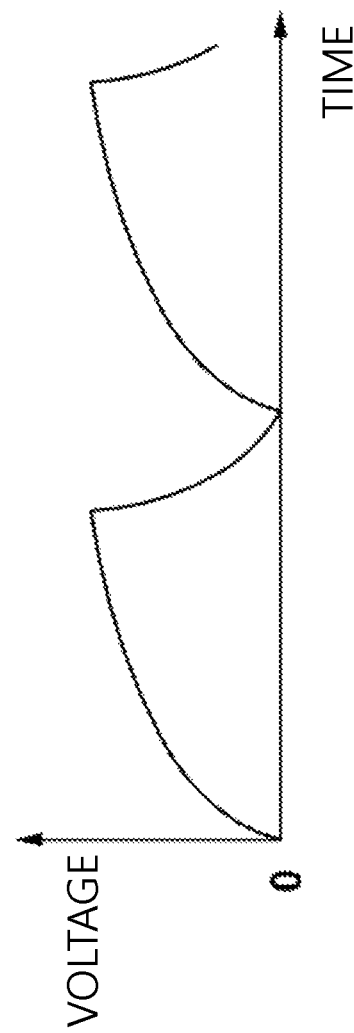
FIG. 6 is an embodiment of a sawtooth voltage waveform used to drive a piezoelectric motor according to embodiment 1.

To drive the support member (140) in the direction of the arrow in FIG. 2, a voltage with a sawtooth waveform such as that shown in FIG. 6 is applied. In the part where the voltage is gradually increased, the length of the piezoelectric material (120) is gradually increased, and at this time, one side of the piezoelectric material (120), which is not fixed to the body (110) because it is fixed to the body (110), increases in the direction of the arrow, and in connection therewith, the rod (130) moves in the direction of the arrow, and the support member (140), which is supported by a predetermined friction force on the rod (130), also moves in the direction of the arrow.

On the other hand, in the part where the voltage decreases rapidly, the length of the piezoelectric material (120) is instantaneously reduced and returns to its original position, and in connection therewith, when the rod (130) moves rapidly in the direction opposite to the arrow, the support member (140) slides by inertia to maintain its position.

This stick/slip behavior allows the support member (140) to drive in the direction of the arrow when a sawtooth waveform voltage is applied. If the opposite behavior is desired, the sawtooth waveform can be applied in a contracting motion.

At this time, the lower surface of the support member (140) slides while directly contacting the upper surface of the body (110), so it is structurally stable and solves the problem of tilting due to the gap formed in the conventional piezoelectric motor or tilting due to the force of the piezoelectric material and the rod.

Figure 11:
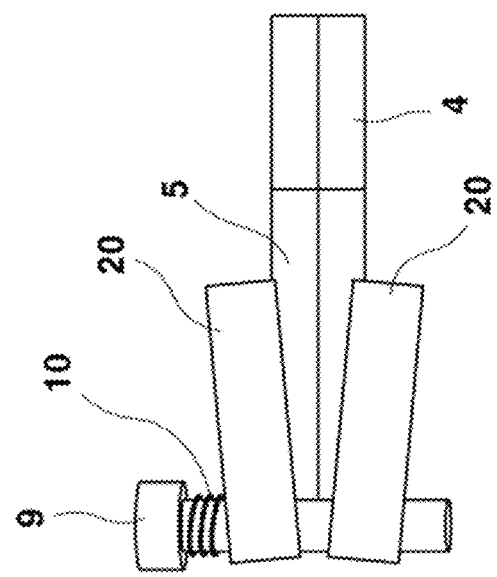
FIG. 11 is a schematic illustration of a support member supporting a rod bonded with a piezoelectric body in a structure of a piezoelectric motor according to the prior art.

Furthermore, in embodiment 1 of the present invention, through the side support holding means (146), by solving the problem that occurs on one side, such as the support member(4) of the prior art (see FIG. 11), as the rod advances in one direction, the area where the friction force control means (145) contacts the rod (130) is reduced, which slows down the movement of the piezoelectric motor and makes linear motion difficult. This enables more precise linear motion.

Figure 7:
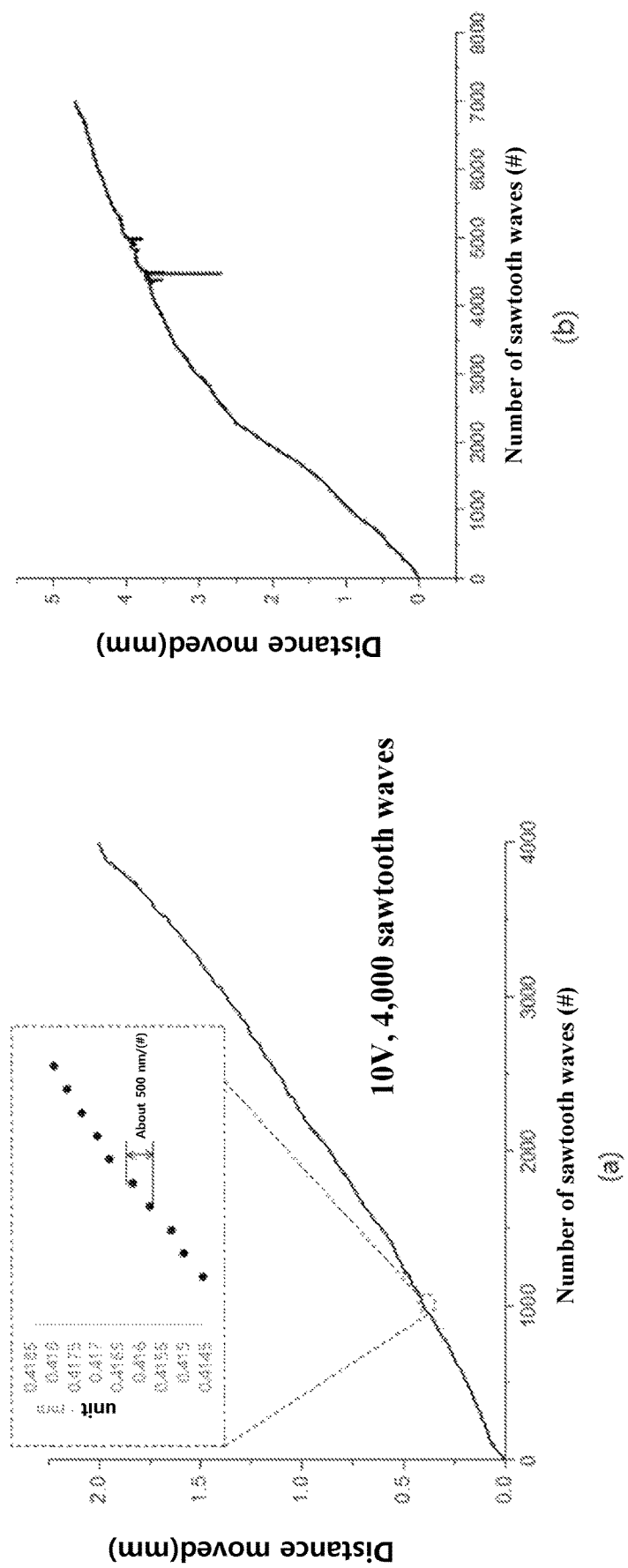
FIG. 7 is a graph (A) showing a driving test result of a piezoelectric motor manufactured according to embodiment 1 of the present invention, and a graph (B) showing a driving test result of a piezoelectric motor of a conventional structure without a side support member.

FIG. 7(*a*) shows embodiment 1 of the present invention. FIG. 7(*a*) is a graph of the distance moved by the piezoelectric motor according to embodiment 1 when 4,000 sawtooth waves at 10 V are applied to the piezoelectric motor. As shown in FIG. 7(*a*), it can be seen that it moved about 2 mm and 500 nm for one sawtooth wave. In other words, it can be seen that the range in which the piezoelectric motor according to Example 1 of the present invention can realize extremely fine resolution at the nanometer level has been greatly expanded to the range of several nm to several mm.

In comparison, as shown in FIG. 7(*b*), in the case of a conventional piezoelectric motor without a side support, partially bouncing values are visible while reading the position, so it can be seen that the stability of the piezoelectric motor according to the embodiment of the present invention is very good.

Embodiment 2

The piezoelectric motor (200) according to embodiment 2 of the present invention is characterized in that, in addition to the piezoelectric motor (100) according to embodiment 1, it further comprises a position sensor (210) measuring a position according to a movement of the workpiece (i.e., the support member (140)). The remaining configurations are identical to those of embodiment 1 and will therefore be omitted from description, and the same drawing numbers will be used to describe the configurations described in embodiment 1.

Figure 8:
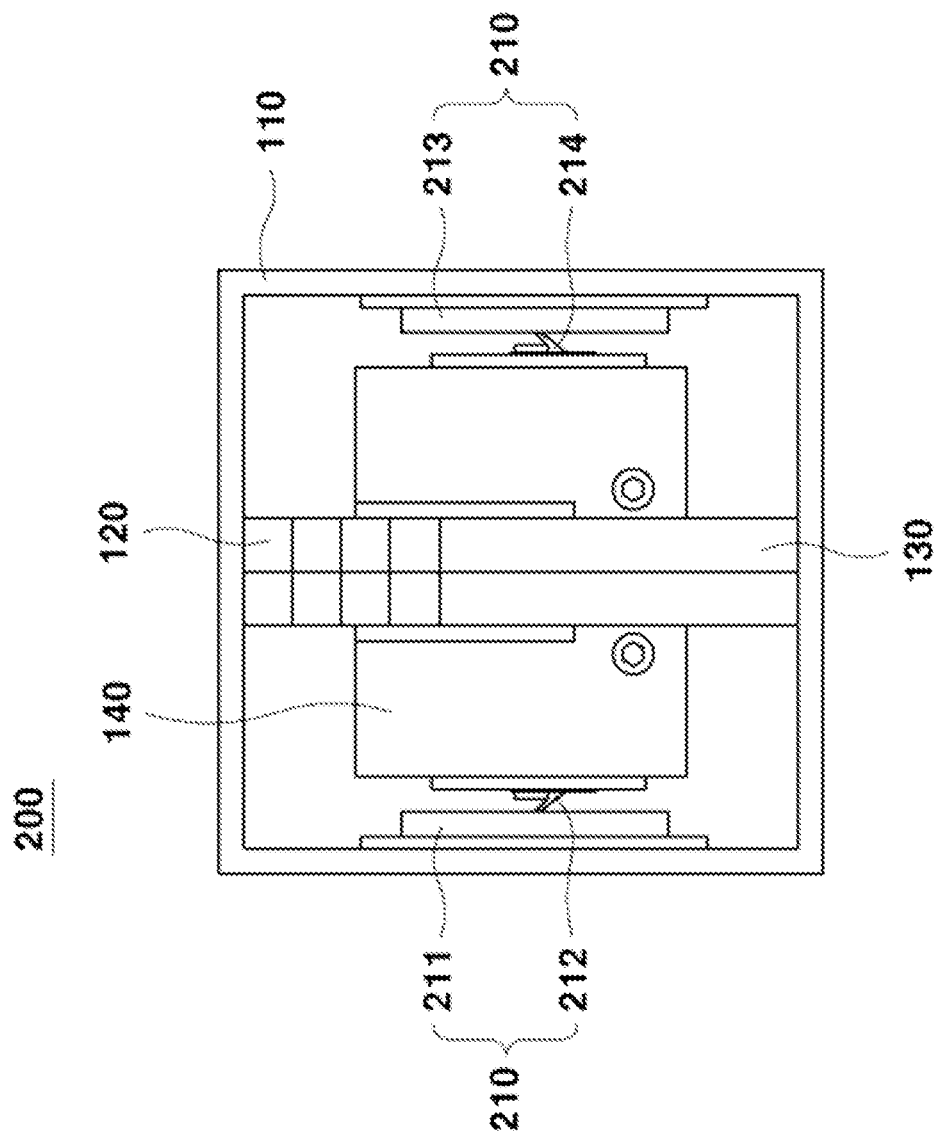
FIG. 8 is a flat cross-sectional view of a piezoelectric motor according to embodiment 2 of the present invention.
Figure 9:
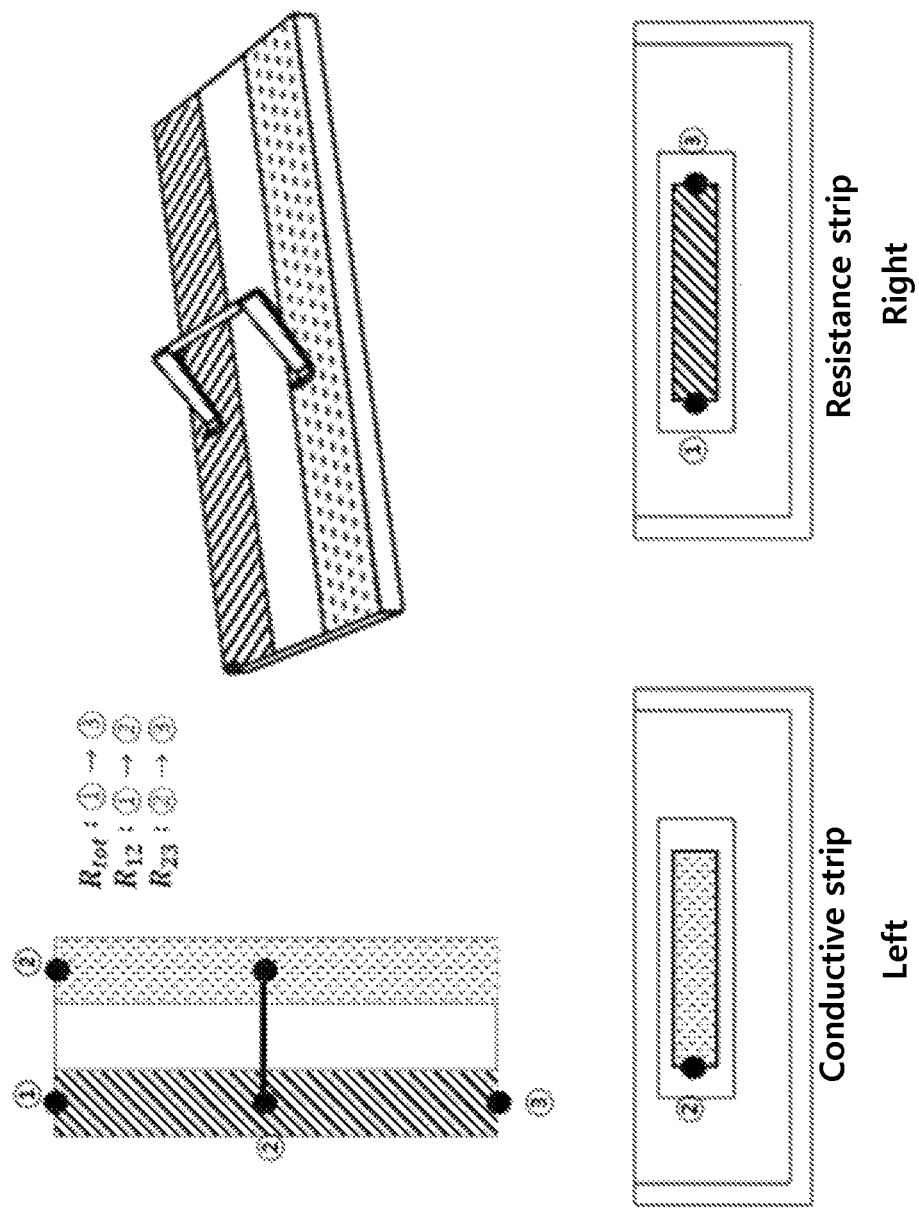
FIG. 9 is a schematic diagram of a position sensor comprising a piezoelectric motor according to embodiment 2 of the present invention.
Figure 10:
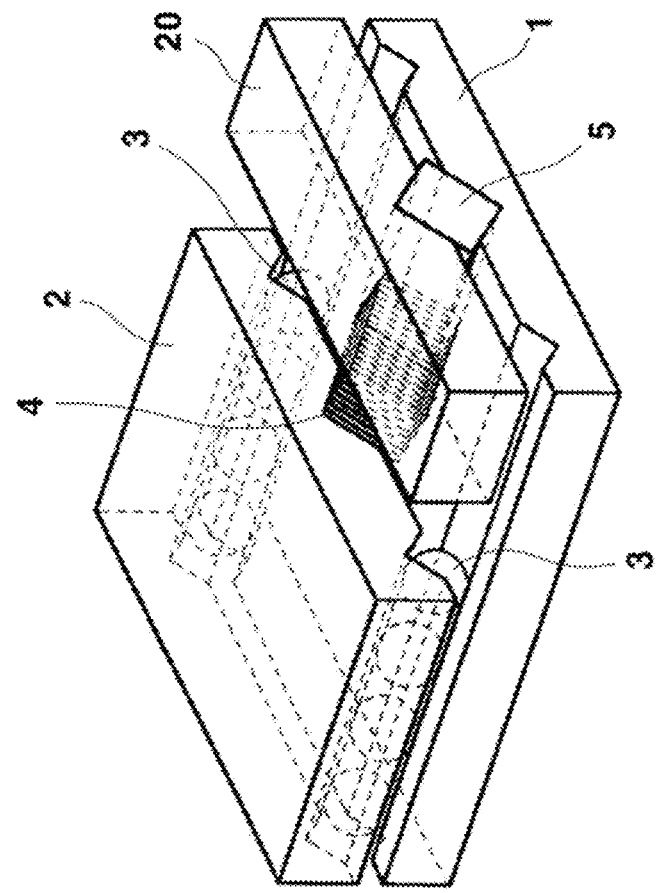
FIG. 10 is a perspective view of a piezoelectric motor according to the prior art.

FIG. 8 is a plan view of a piezoelectric motor according to embodiment 2 of the present invention, and FIG. 9 is a schematic view of a position sensor comprising a piezoelectric motor according to embodiment 2 of the present invention.

Referring to FIGS. 8 and 9, the position sensor (210) includes a conductive strip (211) and a first elastomer (212) in contact with the conductive strip (211), a resistance strip (213) and a second elastomer (214) in electrical contact with the resistance strip (213), and wiring (not shown) electrically connecting the first elastomer (212) and the second elastomer (214).

The conductive strip (211) is formed on one side of the body (110) parallel to the direction of movement of the support member (140), as shown in FIG. 8, and is formed in a dotted pattern, as shown in FIG. 9.

The conductive strip (211) is electrically contacted via the first elastomer (212) comprising a finger spring disposed on one side of the support member (140).

The resistance strip (213) is formed on another side of the body (110) parallel to the direction of movement of the support member (140), as shown in FIG. 8, and is formed in an oblique pattern, as shown in FIG. 9.

The resistance strip (213) is electrically contacted via the second elastomer (214) comprising finger springs disposed on different sides of the support member (140).

On the other hand, if the resistance is read by connecting a wire directly to the finger spring, there is a risk of breaking the wire as the piezoelectric motor moves, and the wire may interfere with the movement of the finger spring. In Embodiment 2 of the present invention, this problem is solved by providing an electrical connection between the finger spring in contact with the resistance and the finger spring in contact with the conductive strip.

With this construction, the total resistance and the resistance between one end of the resistor and the finger spring can be obtained, and the magnitude of this resistance can be converted to a position, so that the position of the walker (i.e., support member (140)) can be accurately known. Specifically, as shown in FIG. 9, a total resistance R and a resistance R13 or R23 between one end of the resistance and the finger spring can be obtained, and the magnitude of the resistance can be converted to a position via R13/R12 or R23/R12. R13/R12 or R23/R12.

Meanwhile, when configuring the position sensor, the finger spring may be disposed on one side of the support member (140) to obtain the position information. However, in this case, the elastic support force of the finger spring is applied to only one side of the piezoelectric material (120), the rod (130), and the support member (140), and this force may separate the layers of the stacked piezoelectric body and/or affect the movement of the piezoelectric motor itself.

In the piezoelectric motor (200) according to embodiment 2 of the present invention, the position sensor (210) is put in opposite sides of the support member (140) by separating the conductive strip (211) and the resistance strip (213), and by placing the two finger springs (212, 214) opposite each other, so that the elastic support force of each other is canceled out, thereby eliminating the problem that the piezoelectric motor is damaged by the elastic support force of the finger springs, or the motion of the piezoelectric motor is affected and the precision of the linear motion is reduced.

With this structure, precise linear motion of the support member (140) is possible, and at the same time, precise measurement of the position of the support member (140) is possible.

EXPLAIN MARK 100, 200: Piezoelectric Motor
110: Body
120: Piezoelectric material
130: Rod
140: Support member
141: Upper Support
142: Lower support
143: 1st side support
144: 2nd Side Support
145: Friction force control means
146: Side support holding means
210: Position Sensor
211: Conductive strip
212: First elastomer
213: Resistance strip
214: Second elastomer

The invention claimed is:

1. A piezoelectric motor comprising:
a body having an upper surface and a lower surface, and a side connecting the upper surface and the lower surface,
a piezoelectric material disposed on the upper surface of the body and extending longitudinally therefrom,
a rod having an upper surface and a lower surface, and extending longitudinally, and having one end connected to one end of the piezoelectric material and disposed on the upper surface of the body, and
a support member disposed to span the rod and providing a predetermined frictional force on the rod,
wherein the support member is driven by the rod to interlock with a contraction or an expansion of the piezoelectric material, and
wherein a lower surface of the support member and the upper surface of the body are at least partially in butted, and wherein the support member is driven by sliding on the upper surface of the body.

2. The piezoelectric motor of claim 1,
wherein the butted portions are polished with abrasive paper of 600 grit or more, or are polished to have a surface roughness lower than a surface roughness obtainable with the abrasive paper.

3. The piezoelectric motor of claim 1,
wherein the support member includes:
an upper support disposed on an upper of the rod, and formed to abut the upper surface of the rod by at least a portion of a lower having a shape corresponding to the upper surface of the rod and
a lower support disposed on a lower side of the rod, and formed to abut the lower surface of the rod by at least a portion of a upper having a shape corresponding to the lower surface of the rod,
a side support having an aperture for inserting the rod, and disposed on a side of the upper support and the lower support, and hold to maintain a spacing between the upper support and the lower support,
wherein a friction force control means for adjusting a friction force applied to portions abutting the rod is put in a portion formed to abut the upper surface of the rod of the upper support and a portion formed to abut the lower surface of the rod of the lower support.

4. The piezoelectric motor of claim 3,
wherein the side support includes,
a first side support disposed on one side of the upper support and the lower support in the direction from which the rod extends; and
a second side support disposed on one side opposite the one side of the upper support and the lower support in the direction from which the rod extends,
a fastening member holding the first side support and the second side support.

5. The piezoelectric motor of claim 3,
Wherein the friction force control means includes,
a bolt inserted into either a portion formed to abut the upper surface of the rod of the upper support or a portion formed to abut the lower surface of the rod of the lower support; and
a spring inserted into the outer circumference of the bolt; and
a helix part formed proximate end of the bolt to hold the end of the bolt.

6. A piezoelectric motor comprising:
A body having an upper surface and a lower surface, and a side connecting the upper surface and the lower surface,
a piezoelectric material disposed on the upper surface of the body and extending longitudinally therefrom; and
a rod having an upper surface and a lower surface, extending longitudinally and having a one end fixed to a one end of the piezoelectric material, and disposed on the upper surface of the body; and
a support member disposed to span the rod, and providing a predetermined frictional force on the rod; and
a position sensor for detecting a position of the support member,
wherein the support member is driven by the rod to interlock with a contraction or an expansion of the piezoelectric material, and
wherein the position sensor includes, a conductive strip disposed on one side parallel to a direction of driving of the support member, a first elastomer in contact with the conductive strip, and a resistance strip disposed on a different side of the support member opposite the one side, and a second elastomer in contact with the resistance strip, wherein the first elastomer and the second elastomer are arranged such that the elastic forces exerted on the support member cancel each other out.

* * * * *